(12) United States Patent
Ibanez et al.

(10) Patent No.: US 8,771,379 B2
(45) Date of Patent: Jul. 8, 2014

(54) CRYSTAL GROWTH IN SOLUTION UNDER STATIC CONDITIONS

(75) Inventors: Alain Jean Theodore Ibanez, Voiron (FR); Julien Raphael Zaccaro, Voiron (FR)

(73) Assignee: Centre National de la Recherche Scientifique (C.N.R.S.), Paris (FR)

( * ) Notice: Subject to any disclaimer, the term of this patent is extended or adjusted under 35 U.S.C. 154(b) by 1430 days.

(21) Appl. No.: 12/517,928

(22) PCT Filed: Dec. 3, 2007

(86) PCT No.: PCT/FR2007/001980
§ 371 (c)(1),
(2), (4) Date: Feb. 25, 2011

(87) PCT Pub. No.: WO2008/081103
PCT Pub. Date: Jul. 10, 2008

(65) Prior Publication Data
US 2011/0142741 A1    Jun. 16, 2011

(30) Foreign Application Priority Data
Dec. 6, 2006 (FR) ..................................... 06 55343

(51) Int. Cl.
*C01D 5/00* (2006.01)
(52) U.S. Cl.
USPC ...................................... 23/302 T; 23/295 R
(58) Field of Classification Search
USPC .......................................... 23/302 T, 295 R
See application file for complete search history.

(56) References Cited

U.S. PATENT DOCUMENTS 2,459,869 A    1/1949    Christensen et al.

FOREIGN PATENT DOCUMENTS

| GB | 482 096    | 3/1938 |
| GB | 676 212    | 7/1952 |
| JP | 62-3090 A  | 1/1987 |
| JP | 3-170390 A | 7/1991 |
| JP | 10-130087 A| 5/1998 |

OTHER PUBLICATIONS

K. Fujioka et al., "Basic technology of fast growing for normal and partially deuterated KDP crystals", Proceedings of the SPIE—The International Society for Optical Engineering SPIE—Int. Soc. Opt. Eng USA, vol. 2633, 1995, XP002446694, ISSN:0277-786X, pp. 292-298 (Abstract only).
G. Ravi et al., "Effect of temperature and deuterium concentration on the growth of deuterated potassium dihydrogen phosphate (DKDP) single crystals", Journal of Crystal Growth, ISSN: 0022-0248, vol. 207, No. 2, Dec. 15, 1999, pp. 319-324.
International Search Report dated Jul. 17, 2008, from corresponding PCT application.

*Primary Examiner* — Edward Johnson
(74) *Attorney, Agent, or Firm* — Young & Thompson

(57) ABSTRACT

A method for growing crystals in solution is suitable for the rapid, controlled and effective preparation of crystals of large dimensions from a solution supersaturated with a compound. The crystal growth is carried out under static conditions. To do this: the growth is performed in a crystallization chamber kept at a constant temperature $T_c$, which chamber is in fluid communication with a saturation chamber at a temperature $T_s$, similarly constant and different from $T_c$, with solubility of the compound at the temperature $T_s$ greater than the solubility of the compound at the temperature $T_c$. A continuous circulation of the solution between the crystallization and saturation chambers is established, thus maintaining a constant supersaturation rate within the crystallization chamber. Furthermore, the circulating solution is subjected to a treatment for eliminating and inhibiting the formation of aggregates, enabling the nucleation of parasitic crystallites to be inhibited.

23 Claims, 1 Drawing Sheet

CRYSTAL GROWTH IN SOLUTION UNDER STATIC CONDITIONS

FIELD OF THE INVENTION

The present invention relates to a new method of crystallogenesis by crystal growth in solution, especially suitable for implementation on an industrial scale to prepare monocrystals of large dimension, of the order of several centimeters or more, in a controlled and effective manner.

BACKGROUND OF THE INVENTION

Various processes for the preparation of monocrystals are currently known, which processes may be exploited on an industrial scale.

An especially interesting such process consists in growing the monocrystal from a melt bath of the compound to be crystallised, in particular by implementing the conventional method known as the Czochralski method. Such a method offers, inter alia, the advantage of leading to especially fast rates of crystal growth, typically of the order of several centimeters per day.

However, growing crystals from melt baths is not possible for some compounds, notably those exhibiting non-congruent melting (i.e. those which have a composition in the liquid state which differs from that in the solid state due, for example, to chemical decomposition phenomena or peritectics), and for those having a transition phase between the molten and the liquid state within a temperature zone between their melting temperature and the ambient temperature. Thus, the melt bath process is shown in fact to be unsuitable for the crystallisation of numerous compounds such as, among numerous other examples, the α-form of quartz (α-$SiO_2$), some phosphates (such as $KH_2PO_4$, $KTiOPO_4$, for example), some borates (such as $YAl_3(BO_3)_4$), and even certain metal halides.

For the crystallisation of compounds unsuited to the melt bath process, such as those mentioned above, it has been proposed to implement methods of growing crystals in solution, wherein the compound to be crystallised is initially dissolved in a solvent, and growth is produced by exposing the solution to super-saturation conditions, that is, conditions wherein the solute is at a concentration greater than its solubility.

In methods of this type, at any given instant the supersaturation state of the solution in which crystallisation has occurred may be quantified by its relative supersaturation, represented by s and calculated according to the following relationship:

$$s = \frac{(C - C_0)}{C_0}$$

wherein:
C represents the concentration of dissolved compound in the solution; and
$C_0$ represents the solubility of the dissolved compound at the temperature at which crystallisation occurs.

This state of supersaturation, a prerequisite for crystallisation in solution, is conventionally obtained using two kinds of methods:

by solvent evaporation:
according to this first variant, the quantity of solvent in the solution is reduced in the course of crystallisation, generally by allowing the said solvent to evaporate gradually, leading to an increase in the compound/solvent ratio in the medium, which enables the concentration to be initially increased to achieve the supersaturation required to initiate crystallisation, and then allows the supersaturated state to be maintained in proportion as the compound in solution is consumed to form the crystal.

by temperature change:
according to this alternative variant, the temperature of the solution is altered in such a way as to induce a decrease in the solubility of the compound to be crystallised in the crystallisation solution, so as to obtain the desired supersaturation. For the majority of compounds, solubility increases with temperature; the desired decrease in solubility is therefore usually obtained by reducing the temperature of the crystallisation solution. Nevertheless, there are a number of individual compounds, limestone for example, the solubility of which is retrograde, i.e. it decreases as temperature rises. For this type of compound, the converse happens, the desired decrease in solubility is achieved by raising the temperature.

In the methods which employ a change in temperature, supplementary control of the reaction conditions proves necessary in order to sustain the crystallisation process. This is because the crystal formation produced by the temperature change consumes the compound in solution, lowering the concentration of the said compound in the crystallisation solution, the very thing which induces a tendency to deviate from the required supersaturation conditions. To counterbalance this phenomenon of desaturation of the solution and maintain a state of supersaturation, a specific possibility consists in carrying out a continuous temperature modification (usually a continuous lowering of the temperature or, more specifically, a continuous increase in the specific case of compounds of retrograde solubility).

The aforementioned methods of crystallisation, by evaporation of solvent or temperature change, usually prove unsuitable for implementation on an industrial scale for the preparation of crystals of large dimension.

In this regard it should first of all be noted that the currently known methods of crystallogenesis in solution do not permit control of the thermodynamic and kinetic conditions of crystal formation:

in the case of crystal growth by solvent evaporation, the conditions of crystallisation (volume of the reaction medium, concentration) change constantly as the reaction progresses. In particular the concentration of impurities in solution tends to increase in the course of crystal growth, leading to an increase over time in the incorporation of these impurities in the forming crystals. Furthermore, the process of evaporation is itself often difficult to control. Methods of crystal growth by solvent evaporation are therefore in practice used only in the laboratory and actually have found no use on an industrial scale.

similarly, in methods employing a temperature change, this change in temperature again causes a change in the thermodynamic and kinetic conditions during crystallogenesis, and maintaining supersaturation throughout the growth phase is difficult to achieve and in fact remains empirical.

The changing conditions of crystallogenesis produced within the framework of current methods of crystal growth in solution has a direct impact on the quality of the crystals produced.

These changing conditions of crystal growth prove especially problematic when it is intended to grow crystals which are not based on definite compounds, but on intermediate compositions such as, for example, solid solutions or doped compounds (especially intermediate compositions of substituted solid solutions wherein a plurality of atom types of differing chemical nature occupy the same site on the crystalline structure, and/or compounds doped with interstitial members, for example crystals doped with insertion ions).

Indeed, in this circumstance the change in the thermodynamic and kinetic conditions is usually associated with substantial modifications in the mechanisms of crystal formation. These modifications may especially lead to a variation in the rate of incorporation of substituent and/or interstitial species and therefore give rise to inhomogeneities in the composition of the crystal formed. These instabilities may similarly lead to the formation of defects in the crystalline structure (defects in the lattice arrangement, dislocations, etc.), and in extreme cases to the insertion of solvent into the crystal. More generally, these different phenomena are capable of leading to a degradation in the quality of the crystal. Typically, the gradual change in the rate of incorporation of substituent and/or doping members and/or of impurities may especially induce a progressive change in the crystalline mesh parameters during growth, usually leading to tensions within the crystal, a cause of numerous crystalline defects such as dislocations, or even more macroscopic fractures. The larger the size of the crystal formed, the more substantial are these phenomena.

Another more general problem encountered with the use of currently known methods of crystal growth in solution is that these methods generally yield limited rates of crystal growth distinctly slower than those obtained with processes using melt baths.

Indeed, in methods of crystallogenesis in solution, the rate of crystal growth is directly proportional to the relative supersaturation of the solution in which the crystallisation is carried out.

In the majority of cases, notably to avoid spontaneous nucleation of crystallites, conventional crystal growth in solution is typically carried out at low rates of supersaturation s, typically of around 1-5%, corresponding to rates of crystal growth in solution of the order of a few millimeters per day. With this type of reduced crystal growth rate, the preparation of monocrystals several centimeters in dimension may take a number of weeks or even months. For some compounds, the preparation time is even of the order of one year or longer.

To try to counter this difficulty, a method of crystal growth by temperature reduction has been developed wherein it is proposed to filter and heat-treat the solution so as to avoid spontaneous nucleation, which makes it possible to increase the rate of temperature reduction with the aim of increasing the supersaturation and thus the rate of crystal growth. Within this framework, methods of preparing giant crystals of potassium disphosphate $KH_2PO_4$ (or KDP) have been described, wherein one has attempted to increase the supersaturation state to values of the order of 30% with the aim of increasing growth rates to 3-4 cm/day. While such methods prove effective with crystals of relatively small size (of the order of a few centimeters), the growth rate remains limited in practice when forming crystals of larger dimension (for example of the order of about 10 centimeters or more). Moreover, the rates of temperature reduction necessary to obtain significant rates of crystal growth produce a thermal gradient between the centre of the forming macrocrystals and the periphery of the crystal in contact with the colder solution. This gradient creates stresses within the crystal which usually induce fracture phenomena when excessively high rates of growth are employed. Thus, although supersaturation of 30% and growth rates of 3 cm/day have been achieved, the growth of monocrystals of large size using this system based on temperature reduction is only possible at rates of at most 1 cm/day.

SUMMARY OF THE INVENTION

An aim of the present invention is to provide a method of crystallogenesis by means of crystal growth in solution which is suitable for implementation on an industrial scale while avoiding the drawbacks of the currently known methods of crystallisation in solution.

To this end, according to a first aspect, one object of the present invention is a method of preparing a crystal based on a compound (C) by crystal growth in solution, starting from a solution (S) supersaturated with the said compound (C), wherein:

the said crystal growth is carried out within a crystallisation chamber maintained at a constant temperature of crystallisation $T_c$;

the said crystallisation chamber is in fluid communication with a saturation chamber which includes an excess of compound (C) in the form of a solid feeder substance and is brought to a constant saturation temperature $T_s$ different from $T_c$, this temperature $T_s$ being selected in such a way that the solubility of the compound (C) in the solution (S) at the temperature $T_s$ is greater than the solubility of the compound (C) in the solution (S) at the temperature $T_c$; and a continuous circulation of the solution (S) is set up, preferably at a substantially constant flow rate, between the crystallisation and saturation chambers, by which a constant rate of supersaturation is maintained within the crystallisation chamber; and the solution (S) circulating between the crystallisation and saturation chambers is subjected to a treatment for eliminating aggregates likely to form there and for inhibiting the formation of these aggregates, to avoid or inhibit phenomena of nucleation of parasitic crystallites.

DETAILED DESCRIPTION OF THE INVENTION

According to a first variant of the method, the compound (C) used is a compound having a solubility in the solution (S) which increases with temperature. In this circumstance, the temperature $T_s$ kept constant within the saturation chamber is higher than the temperature $T_c$ kept constant within the crystallisation chamber.

According to a more specific variant, the compound (C) is, conversely, a compound with a retrograde solubility, i.e. which has a solubility in the solution (S) which decreases with temperature. According to this second variant, the temperature $T_s$ kept constant within the saturation chamber is lower than the temperature $T_c$ kept constant within the crystallisation chamber.

In the method according to the invention, the crystallisation temperature $T_c$ of the crystallisation chamber and the saturation temperature $T_s$ of the saturation chamber are both kept constant during the crystallogenesis process. Within the meaning of the present description, the expression "constant temperature" is intended to refer to a temperature which varies as little as possible on either side of a reference value $T^0$, this temperature generally varying over time by at the most +/−0.1° C., more preferably by at the most +/−0.05° C., in other words this temperature preferably remains within the range from ($T^0$−0.1° C.) to ($T^{0+0.1°}$ C.), yet more preferably from ($T^0-0.05°$ C.) to ($T^0+0.05°$ C.), more advantageously from ($T^0-0.01°$ C.) to ($T^0+0.01°$ C.), the acceptable temperature variation being a function of the nature of the compound used, of the solvent, and similarly of the temperature $T^0$. It is very especially important to maintain a constant temperature of crystallisation $T_c$, the value of which is advantageously set to within +/−0.05° C., preferably to within +/−0.01° C., and yet more preferably to within +/−0.005° C. Regulation of the supersaturation temperature $T_s$ may be a little less precise, but usually remains regulated to within +/−0.1° C., preferably to within +/−0.05° C., more advantageously to within +/−0.01° C.

In the method according to the invention, specific maintenance of the crystallisation temperature $T_c$ and of the saturation temperature $T_s$ at constant values, associated with continuous circulation of the solution (S) between the crystallisation and saturation chambers, induces very specific conditions of crystallogenesis. In particular, by contrast with the currently proposed crystallogenesis in solution, the method according to the invention specifically implements crystal growth under static thermodynamic conditions.

More precisely, owing to maintenance of the saturation temperature $T_s$ at a constant value and continuous circulation of the solution (S) between the crystallisation and saturation chambers, the concentration of compound within the saturation chamber (C) remains constant, that is, equal to the solubility of the compound (C) at the temperature $T_s$. To optimise this concentration-maintaining effect, a minimum rate of circulation of the solution (S) between the crystallisation chambers must generally be applied. It is within the competence of the person skilled in the art to adjust the circulation rate of the solution (S) to this effect, on a case by case basis.

Taking account of the effect of stabilisation of the concentration obtained according to the method of the invention, the solution (S) which leaves the saturation chamber and is then injected into the crystallisation chamber has a permanently constant concentration, equal to the solubility of the compound (C) at the temperature $T_s$.

Consequently, given that, within the crystallisation chamber, the temperature of crystallisation $T_c$ is maintained at a temperature at which the compound (C) has a solubility lower than its solubility at the saturation temperature $T_s$, the solution (S) is injected into the crystallisation chamber with a concentration of the compound (C) greater than the solubility of the compound (C) at the temperature $T_s$, in other words this solution is permanently in a supersaturated state within the crystallisation chamber. Similarly in the method according to the invention, a supersaturated state is permanently maintained within the crystallisation chamber. To the extent that the crystallisation temperature $T_c$ is kept substantially constant within the crystallisation chamber, the relative supersaturation of the solution (S) is completely defined and remains constant during the crystallisation.

Thus, the method developed by the inventors enables a constant relative supersaturation to be achieved in a method of crystallisation in solution using a very simple technique.

More generally, according to the method of the invention, all conditions of crystallogenesis are kept substantially constant throughout crystal growth. The method according to the invention especially allows constant conditions of temperature, concentration and supersaturation to be maintained simultaneously.

For the purpose of stabilising the conditions of crystal growth still further, the continuous circulation of the solution (s) between the crystallisation and saturation chambers preferably takes place at a substantially constant flow rate. This continuous circulation is generally performed in a circular way, the solution (S) leaving the saturation chamber, in a state of saturation with compound (C), towards the crystallisation chamber along a first duct, then leaving the crystallisation chamber again in the direction of the saturation chamber to be "recharged" with compound (C) along a second duct.

The static thermodynamic conditions of crystal growth obtained within the framework of the method according to the invention especially enable a user to avoid the growth incidents observed using the currently known methods of crystal growth in solution, which employ non-static thermodynamic conditions.

The conditions of implementing the method according to the invention have numerous other advantages relative to the non-static conditions of currently known methods. Working under static conditions according to the invention especially enables the conditions of crystal growth to be stabilised, leading to a significant improvement in crystal quality and to crystals of controlled composition being obtained, which proves especially advantageous in the case of crystals of intermediate composition, notably solid solutions or crystals containing one or more doping element(s), the method then enabling crystals of homogeneous composition to be obtained.

The method according to the invention allows very simple regulation and definition of the relative supersaturation value of the solution (S) within the crystallisation chamber and, as it exits, the rate of crystallisation. According to the invention, this regulation is achieved simply by adjusting the temperature values $T_c$ and $T_s$, the supersaturation increasing with the difference in solubility of the compound (C) at the temperatures $T_s$ and $T_c$. The process developed by the inventors proves in particular to be much more easily implemented than processes wherein saturation is induced by lowering the temperature, in which case the rate of lowering must be continually adjusted. In the method according to the invention, by contrast, to induce the required supersaturation, it is sufficient to keep the temperatures $T_s$ and $T_c$ within the saturation and crystallisation chambers constant and distinct (with $T_s>T_c$ in the case of compounds the solubility of which increases with the temperature and $T_s<T_c$ in the case of compounds of retrograde solubility), which can be achieved very easily and at low cost, notably with the use of thermostatic baths.

Furthermore, because it specifically employs stabilised growth conditions, the method according to the invention is not limited in respect of the supersaturation rate used. Especially, it allows work with elevated supersaturation rates, leading to a very fast rate of crystal growth without inducing the thermal gradient between the centre and the exterior of the crystal which occurs with the implementation of processes of growth in solution by rapid temperature reduction. On the contrary, in the method according to the invention, whatever the rate of growth of the crystal, the latter remains completely thermostatically controlled at the temperature $T_c$ within the crystallisation chamber, from the start of its growth to the end.

Moreover, in the method according to the invention, the supersaturated solution (S) implemented is specifically subjected to a treatment allowing elimination of the aggregates likely to form therein and/or inhibition of the formation of such aggregates to prevent or inhibit phenomena of nucleation of parasitic crystallites.

The potential nucleation of parasitic crystallites is a problem routinely encountered in any method of crystallisation in solution. This disadvantage is linked to the use of supersaturated, metastable solutions, wherein aggregates routinely form from species in solution. As long as these aggregates are of sufficiently small ("subcritical") size, they are not thermodynamically stable and therefore do not give rise to the formation of crystallites. On the other hand, parasitic crystallites form when the aggregates reach or exceed a critical radius r*. The greater the supersaturation in the medium, that is, the greater the departure from the equilibrium conditions of the system, the smaller is this critical radius r*.

This phenomenon is especially pronounced in the methods of crystallisation in solution known hitherto, especially in the methods using temperature reduction, in that they imply working far from conditions of thermodynamic equilibrium. Consequently, to avoid this phenomenon of parasitic nucleation, it is known to continuously treat and filter the growth solution in order to dissociate therefrom the aggregates as they form and to inhibit their development in the form of crystallites. It has for example been proposed to dissociate the aggregates by causing the growth solution to circulate continuously within a treatment cell wherein the solution is filtered in a very powerful manner (typically via membranes of 20 nm porosity) and subjected to superheating.

In the method according to the invention, on account especially of the static conditions established, it proves especially easy to apply this type of anti-nucleation treatment of the solution (S) to inhibit the formation of subcritical aggregates and/or dissociate the aggregates formed.

Consequently, any type of treatment enabling the subcritical aggregates in the circulating supersaturated solution (S) to be eliminated or dissociated may be contemplated within the scope of the invention. This treatment advantageously comprises, among other possible means, submission of the solution (S) to ultrasound between the crystallisation chamber and the saturation chamber. Conjointly with this ultrasound treatment, a heat treatment of the solution may advantageously be used between the crystallisation chamber and the saturation chamber, namely:

in the case of use of a compound (C) having a solubility which increases with temperature: heating of the solution (S) between the crystallisation chamber and the saturation chamber, advantageously at a temperature at least 10° C. higher than that of the saturation temperature $T_s$ to which the crystallisation chamber has been brought;

in the case of use of a compound (C) having a retrograde solubility which decreases with temperature: cooling of the solution (S) between the crystallisation chamber and the saturation chamber, advantageously at a temperature at least 10° C. lower than that of the saturation temperature $T_s$.

The solution (S) may optionally be subjected to a further filtration between the crystallisation chamber and the saturation chamber so as to retain any aggregates that are forming, although this is not routinely necessary.

Taking these various factors into account, the method according to the invention constitutes a very advantageous alternative to the currently known methods, in that it enables the preparation of manner of monocrystals of very large dimensions at very fast speeds by inhibiting the risks of growth incidents and more generally by allowing access to optimised properties of crystallisation.

Consequently, although the method proposed by the inventors is very easily implemented in practice, it quite surprisingly enables optimisation simultaneously of the crystal properties obtained and the rate of crystal growth. One of the substantial advantages of the method according to the invention is that it allows the speed of production to be increased while in conjunction lowering the risks of growth failure. Furthermore, the rates of crystal growth obtainable according to the method of the invention are generally comparable to those documented using melt-bath processes, that is, they are of the order of at least several centimeters per day.

Another advantage of the method according to the invention by comparison with the currently known methods of crystallogenesis in solution is that it allows crystal growth of compounds having very low solubilities or very small changes in solubility with temperature.

The method according to the invention has been shown to be more generally suitable for the crystal growth of numerous chemical compounds. Indeed, any compound may in practice be used as the compound (C) in the method according to the invention provided that it is soluble in a solvent.

In all cases, the method according to the invention is specifically suited to the preparation of monocrystals which are substantially free from defects and which may be of large dimension, for example of the order of around 10 centimeters or more. The invention thus allows access to new monocrystals of quality at least similar to that of the monocrystals obtained according to the melt-bath process, though with compounds (C) which cannot be crystallised using this process. The invention in particular allows rates of rapid growth, giving rise to monocrystals of large size, substantially free from defects and based on compounds (C) devoid of a congruent melting point or compounds (C) exhibiting a phase transition between the molten and the solid state.

Whatever the nature of the compound (C) utilised, the method according to the invention preferably exhibit one or more of the additional characteristics described below.

In the method according to the invention, the supersaturation rate maintained within the crystallisation chamber is advantageously as high as possible, enabling the rate of crystal growth to be increased consequently. This supersaturation rate may be modulated very simply by adjusting the saturation and crystallisation temperatures $T_s$ and $T_c$, and in particular by adjusting the difference $\Delta T$ between these two temperatures.

The precise value of the supersaturation rate within the crystallisation chamber may vary to a very large extent as a function of the nature of the compound (C), but it should be noted that the supersaturation rates which can be reached according to the invention are more elevated than those that may be achieved in the current methods of growth in solution. Typically, according to the method of the invention the rate of supersaturation may be easily modulated and held constant at a value generally within the range 1% to 30%, for example between 1 and 25%, this supersaturation rate being especially capable of attaining values in excess of 10%, for example of at least 15% or even at least 20%, which are much higher than the supersaturation rates envisageable with the current methods of growth in solution.

According to a very specific embodiment of the invention, the method developed by the inventors may especially be used to prepare monocrystals by mass of potassium diphosphate of the type utilised in optical applications, notably to construct devices of the LASER type. In this particular context, the compound (C) is potassium diphosphate $KH_2PO_4$ (KDP), preferably in the at least partially deuterated form (DKDP). The method according to the invention enables optical quality crystals to be obtained easily and rapidly on the basis of these compounds.

It should be emphasised that although a portion of the description which follows has been produced with specific reference to the preparation of crystals of KDP or DKDP, this embodiment is only one among others and should not be considered to be limiting of the invention.

Within the specific context of the use of KDP or DKDP as the compound (C), the temperature $T_c$ at which the crystallisation chamber is maintained is advantageously within the range between 5 and 80° C. According to a more specific embodiment, the method of crystallisation of KDP or DKDP according to the invention may advantageously be conducted at a low temperature, with a temperature $T_c$ at which the crystallisation temperature is maintained of below 40° C., preferably below 30° C., for example between 15 and 25° C. Moreover, the crystallisation temperature advantageously varies by no more than +/−0.1° C., more preferentially by no more than +/−0.05° C. Thus, the temperature T, within the crystallisation chamber may typically be set at 20° C. +/−0.005° C.

Moreover, when the compound (C) is KDP or DKDP, the difference in temperature $(T_s-T_c)$ between the saturation chamber and the crystallisation chamber is preferably of the order of a few degrees, this temperature difference being variable as a function of $T_c$ and of the desired growth rate. This temperature difference is typically between 2 and 30° C., this difference being advantageously of at least 10° C., for example between 15 and 20° C.

The monocrystals by mass of substantially defect-free DKDP, which are obtainable according to this specific embodiment of the invention, advantageously having at least one dimension greater than or equal to 10 cm, constitute in accordance with a specific aspect of another subject of the present invention.

These monocrystals of DKDP exhibit very good qualities and in particular are substantially free from defects and exhibit a homogeneous deuterium/hydrogen ratio within the material, making them very good materials for optical applications.

According to a more specific aspect, one object of the present invention is also a device for implementing the method according to the invention.

This device comprises:
a crystallisation chamber, suitable for growing a crystal in solution and provided with an inlet and an outlet, as well as means of temperature regulation allowing the said crystallisation chamber to be maintained at a substantially constant crystallisation temperature $T_c$, typically at temperatures ranging from −30° C. to +150° C.;
a saturation chamber, suitable for placing a solution in contact with an excess of solid solute and provided with an inlet in fluid communication with the outlet of the crystallisation chamber, and with an outlet in fluid communication with the inlet of the crystallisation chamber, as well as means of temperature regulation enabling the said saturation chamber to be maintained at a substantially constant crystallisation temperature $T_s$ distinct from $T_c$; and
means permitting the continuous circulation of a solution between the two chambers, from the outlet of the saturation chamber towards the inlet of the crystallisation chamber, and from the outlet of the crystallisation chamber towards the inlet of the saturation chamber, these circulation means further being provided with means of eliminating aggregates capable of forming in the circulating solution and means of inhibiting the formation of such aggregates.

According to an advantageous embodiment, the means permitting continuous circulation of the solution between the two chambers are provided with means of sonification generally associated with thermal treatment means for heating or cooling the solution, and optionally means of filtration, as a general rule between the outlet of the crystallisation chamber and the inlet of the saturation chamber.

BRIEF SUMMARY OF THE DRAWINGS

The invention will be described in greater detail on the basis of the attached drawings wherein.

Figure 1:
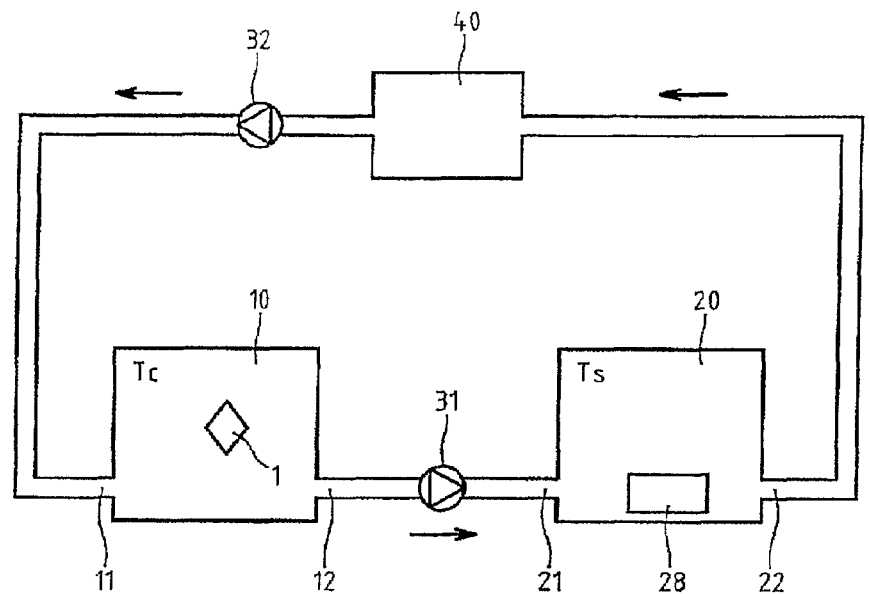
FIG. 1 is a schematic representation of a possible device for implementing the method according to the invention.

These drawings show the growth of a crystal 1 from a compound (C) (which may for example, though not necessarily, be DKDP) within a crystallisation chamber 10 provided with an inlet 11 and an outlet 12. The temperature $T_c$ within this chamber 10 is held constant by suitable regulation means, such as the thermostatic bath 15 represented in FIG. 2.

The crystallisation chamber is continuously fed with a solution (S) originating from a saturation chamber 20 provided with an inlet 21 and an outlet 22. This chamber is similarly maintained at a constant temperature (Ts) by suitable regulation means, such as the thermostatic bath 25 represented in FIG. 2. In the case of the growth of DKDP, the temperature Ts is higher than Tc, for example by at least 10° C. In the most general case, Ts differs from Tc by several degrees, or even several tens of degrees. The saturation chamber contains an excess of compound (C) in the state of a solid feeder substance 28, allowing the solution to be saturated at the said saturation chamber (within the chamber 20 the concentration of the compound (C) in the solution (S) is equal to the saturation concentration of the compound (C) at temperature Ts).

Figure 2:
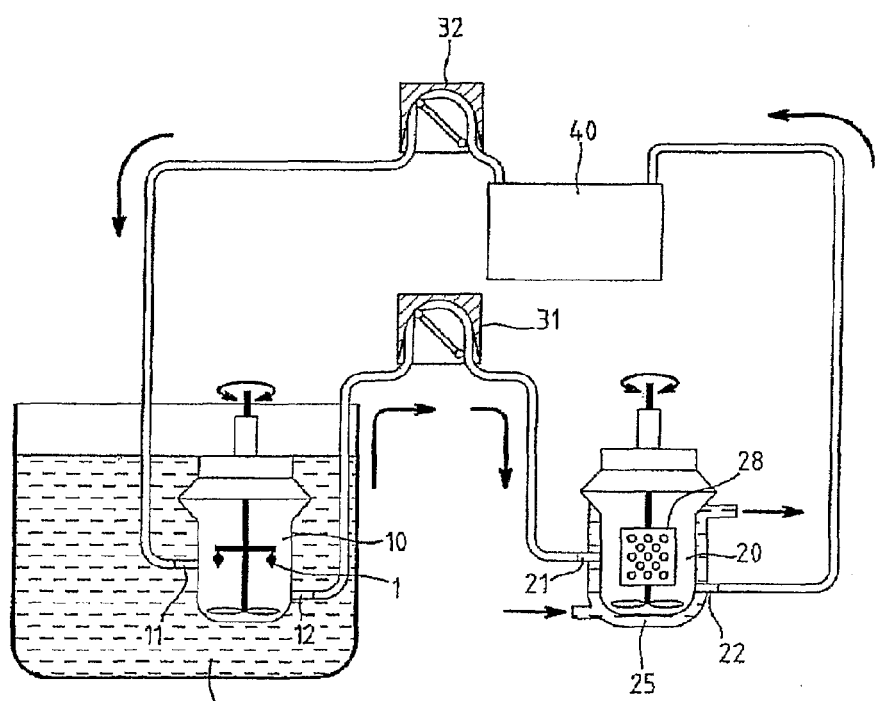
FIG. 2 represents an actual example of a device useful for carrying out the crystallisation according to the invention.

The chambers 10 and 20 are generally provided with agitation and homogenisation means in particular of the type represented in FIG. 2.

The direction of circulation of the solution (S) is indicated by means of arrows on the figures: the solution is discharged from the outlet 22 of the saturation chamber 20 towards the inlet 11 of the crystallisation chamber 10, then leaves this chamber 10 via the outlet 12 and is again discharged in the direction of the inlet 21 of the saturation chamber. This circulation is ensured by suitable means designated by 31 and 32 in the figures, which may in particular be peristaltic pumps like those represented in FIG. 2. These means are generally employed to ensure a constant flow rate of the solution (S) throughout crystallogenesis.

The saturated solution leaving the saturation chamber 20 at the temperature Ts is sent into the crystallisation chamber 10 maintained at a constant temperature distinct from Tc, selected to place the solution in a condition of supersaturation, thus permitting growth of the crystal 1 from the solution (S). The solution (S), depleted of compound (C) by consumption during crystal growth, then leaves the crystallisation chamber to become re-enriched with compound (C) in the saturation chamber 20.

The circulation circuit of the solution (S) advantageously comprises, between the outlet 12 of the crystallisation chamber and the inlet 21 of the saturation chamber, and/or between the outlet 22 of the saturation chamber 20 and the inlet 11 of the crystallization chamber 10, a chamber 40 provided with sonification means, wherein it is also preferable for the solution to be thermally treated by heating or cooling, in the direction leading to subsaturation of the solution, these means enabling the parasitic nucleation phenomena in the solution to be inhibited by limiting the formation of aggregates and/or by disaggregating existing aggregates. As a safety measure, the circulation circuit of the solution (S) may furthermore comprise means for filtering the solution.

As the figures show, the method according to the invention is very easily implemented and necessitates only trivial means of precise temperature and flow rate regulation, which are much more readily implemented than the means of regulation required in currently known crystal growth methods using a controlled reduction in temperature.

The invention claimed is:

1. A method of preparing a crystal based on a compound (C), by crystal growth in solution, the method comprising:
providing a crystallization system comprising:
a solution (S) supersaturated with said compound (C), a crystallization chamber, in fluid communication with a saturation chamber, said saturation chamber including a source of compound (C) in the form of a feeder substance;
maintaining a constant crystallization temperature ($T_c$) in the crystallization chamber and a constant saturation temperature ($T_s$) in the saturation chamber, wherein $T_c$ is different from $T_s$ and the solubility of the compound (C) in the solution (S) at the temperature $T_s$ is greater than the solubility of the compound (C) in the solution (S) at the temperature $T_c$;
circulating solution (S) in a continuous flow circuit between the saturation chamber and the crystallization chamber, wherein the solution is circulated at a substantially constant flow rate; and
carrying out the crystal growth within the crystallization chamber, while maintaining the constant crystallization temperature $T_c$, the constant saturation temperature $T_s$, and the substantially constant flow rate, in order to maintain a constant rate of supersaturation within the crystallization chamber during the crystal growth.

2. The method according to claim 1, wherein the crystallization system further comprises an aggregation treatment element, the method further comprising treating the circulating solution with said aggregation treatment element to remove, or inhibit the formation of, aggregates in the solution.

3. The method according to claim 2, wherein the treating the circulating solution comprises submitting the circulating solution (S) to ultrasound between the crystallization chamber and the saturation chamber.

4. The method according to claim 1, wherein the compound (C) has a solubility in the solution (S) which increases with an increase in temperature, and wherein the temperature $T_s$ kept constant within the saturation chamber is higher than the temperature $T_c$ kept constant within the crystallization chamber.

5. The method according to claim 4, further comprising heating the circulating solution and treating the circulating solution with ultrasound, between the crystallization chamber and the saturation chamber, in order to remove, or inhibit the formation of, aggregates in the solution.

6. The method according to claim 1, wherein the compound (C) has a solubility within the solution (S) which increases with a decrease in temperature, and wherein the temperature $T_s$ kept constant within the saturation chamber is lower than the temperature $T_c$ kept constant within the crystallization chamber.

7. The method according to claim 6, further comprising cooling the circulating solution and treating the circulating solution with ultrasound, between the crystallization chamber and the saturation chamber, in order to remove, or inhibit the formation of, aggregates in the solution.

8. The method according to claim 1, wherein the supersaturation rate kept constant within the crystallization chamber is greater than 10%.

9. The method according to claim 1, wherein the compound (C) is potassium diphosphate $KH_2PO_4$ (KDP) or potassium diphosphate in an at least partially deuterated form (DKPD).

10. The method according to claim 9, wherein the temperature difference ($T_s-T_c$) between the saturation chamber and the crystallization chamber is between 2° C. and 30° C.

11. The method according to claim 9, wherein the temperature difference ($T_s-T_c$) between the saturation chamber and the crystallization chamber is between 15° C. to 20° C.

12. The method according to claim 1, wherein the $T_c$ is maintained at a temperature below 40° C.

13. The method of claim 12, wherein the $T_c$ is maintained at a temperature below 30° C.

14. A device for implementing the method of claim 1, comprising:
a crystallization chamber configured for growing the crystal in solution, said crystallization chamber comprising an inlet and an outlet;
a means for regulating the temperature of the crystallization chamber and for maintaining a substantially constant crystallization temperature $T_c$ within the crystallization chamber;
a saturation chamber configured for placing the solution (S) in contact with an excess of solid solute, said saturation chamber comprising an inlet in fluid communication with the outlet of the crystallization chamber, and an outlet in fluid communication with the inlet of the crystallization chamber,
a means for regulating the temperature of the saturation chamber and for maintaining a substantially constant saturation temperature $T_s$ within the saturation chamber distinct from $T_c$; and
a continuous circulation system configured to circulate the solution (S) at a substantially constant flow rate between the crystallization chamber and the saturation chamber, the flow being in a direction from the outlet of the saturation chamber towards the inlet of the crystallization chamber, and from the outlet of the crystallization chamber towards the inlet of the saturation chamber.

15. The device according to claim 14, wherein the continuous circulation system further comprises an aggregation treatment element configured to treat the circulating solution to remove or inhibit the formation of aggregates in the solution.

16. The device according to claim 15, wherein the aggregation treatment element comprises a means for sonicating the solution.

17. The device according to claim 16, wherein the continuous circulation system further comprises a means for heating or cooling the circulating solution.

18. The method according to claim 1, wherein the $T_c$ and the $T_s$ are each maintained at a constant temperature that varies over time by less than +/−0.1° C.

19. The method according to claim 1, wherein the $T_c$ and the $T_s$ are each maintained at a constant temperature that varies over time by less than +/−0.01° C.

20. The method according to claim 1, wherein the compound (C) comprises one or more doping element.

21. The method according to claim 1, wherein the crystal is grown to a size having at least one dimension of 10 centimeters or more.

22. The method according to claim 1, wherein the supersaturation rate kept constant within the crystallization chamber is at least 15% to 20%.

23. The method according to claim 1, wherein the solid feeder substance is contained within the saturation chamber.

* * * * *